United States Patent [19]
Last et al.

[11] 3,968,493
[45] July 6, 1976

[54] DIGITAL PHASE COMPARATORS

[75] Inventors: James David Last, Llanfairfechan; Emyr Wyn Roberts, Bangor, both of Wales

[73] Assignee: University of North Wales, Caernarvon, Wales

[22] Filed: Sept. 18, 1974

[21] Appl. No.: 507,185

[30] Foreign Application Priority Data
Sept. 19, 1973 United Kingdom............... 44018/73

[52] U.S. Cl............................ 343/105 R; 324/83 D
[51] Int. Cl.²...................... G01S 1/30; G01R 25/00
[58] Field of Search................. 343/105 R; 324/83 D

[56] References Cited
UNITED STATES PATENTS
| | | | |
|---|---|---|---|
| 3,760,270 | 9/1973 | Irvin.................................. | 324/83 D |
| 3,852,751 | 12/1974 | Wood............................. | 343/105 R |

*Primary Examiner*—Maynard R. Wilbur
*Assistant Examiner*—Richard E. Berger
*Attorney, Agent, or Firm*—Cushman, Darby and Cushman

[57] ABSTRACT

In a phase comparison radio navigation system in which phase-locked signals of the same frequency are radiated in succession from spaced stations and are compared in phase at a receiver, instead of locking an oscillator or oscillators at the receiver to received signals to provide simultaneously available signals for phase comparison, each received signal is compared in turn in digital phase comparison means with a free-running oscillator, two successive comparisons of the oscillator with one received signal being used to determine the phase error rate of the oscillator and this error rate being used to correct the other phase determinations.

9 Claims, 6 Drawing Figures

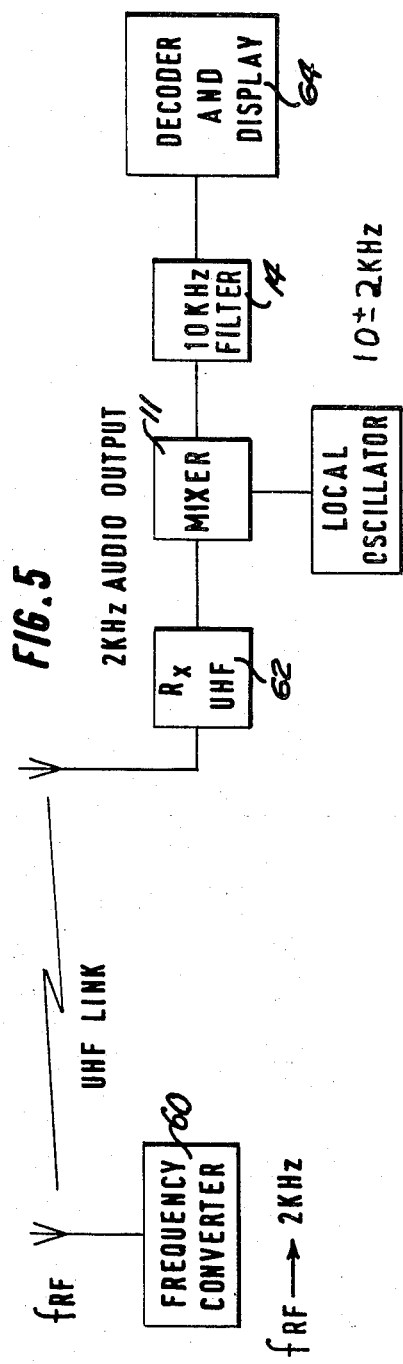
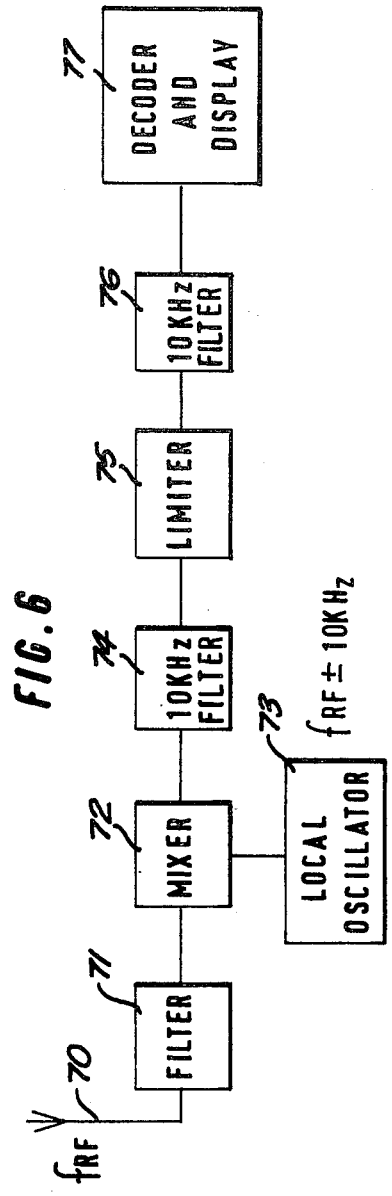

DIGITAL PHASE COMPARATORS

BACKGROUND OF THE INVENTION

1. Field of the Invention

This invention relates to digital phase comparators and to phase comparison radio navigation systems using digital phase comparators.

2. Prior Art

In some types of phase comparison radio navigation systems, the signals to be compared in phase occur simultaneously and it is thus possible to use one waveform as a reference for measuring the phase of the other waveform. The present invention is concerned more particularly however with the measurement of the phase relationship between signals which do not occur simultaneously. Such a requirement arises for example in phase comparison radio navigation systems, such as the Decca Hi-Fix and Sea-Fix (Decca is a Registered Trade Mark), in which signals of the same frequency are radiated sequentially from spaced stations and their phase relationship determined at a receiver. In each of these systems, a signal is radiated firstly from a master station, then from the first slave station and then from a second slave station. These signals are radiated in a predetermined phase relationship and are of the same frequency. At a receiver, the phase relationship between these signals is determined in order to provide information determining the position of the receiver. If the master and the two slave stations are spaced apart at fixed locations and the receiver is on a vehicle or other movable body then such a system forms a hyperbolic navigation system. However, in the particular systems described above, the receiver and the master station may be carried on one vessel which makes use of two slave transmitters at fixed spaced locations. Such a system is known as a two-range system since each of the phase relationships between the signals from the master and a slave station is a measure of the range between the vessel and that slave station.

In the Decca Navigator system, there are sequential transmissions for lane or zone identification purposes, which transmissions can be used, independently of the other transmissions, for position fixing and the discriminator of the present invention may also be used for determination of phase relationship between such sequential transmissions.

In systems in which the signals are radiated in sequence, the practice heretofore has been to have, in the receiver, an oscillator which is phase-locked to the received signals from the master station. Signals from the slave station, when they are received, are compared in phase with the simultaneously-available signals from the oscillator to give the required phase measurements.

It is convenient to indicate phase relationships in decimal digits on digital displays; this can readily be done in the case of simultaneously available signals by determining the time interval (using a clock pulse generator and counter feeding a digital display) between a point on a cycle of one signal and a corresponding point on a cycle of the other signal. It is convenient to use the zero-crossing points as these are accurately identifiable. The present invention however is concerned with a phase discriminator which can determine the phase relationship between signals which are not simultaneously available.

SUMMARY OF THE INVENTION

It is one of the objects of the present invention to provide an improved form of digital phase comparison system in which it is not necessary to have an oscillator locked in phase to one of the received signals.

According to the present invention a digital phase comparator for determining the phase relationship between a first signal and a further signal of the same frequency which signals are available sequentially in a regular cyclic sequence comprises a reference oscillator of a frequency equal to or approximately equal to the frequency of said signals, digital phase determining means for determining the phase relationships between a signal from the reference oscillator and each of the first and further signals and including subtracting means to determine the difference between these two phase relationships, means for determining the rate of phase change between the first signal and the reference signal, and correction means utilizing the rate information as a measure of the rate of phase change of the reference signal to correct the phase difference determination between the further signal and the reference signal in accordance with this rate and the time period between the determinations of the phase relationships between the first signal with respect to the reference and the further signal with respect to the reference signal for any change in the phase of the reference signal with respect to the first signal during that time period. It will be seen that this arrangement utilises a continuously running reference oscillator but that it does not have to be maintained exactly in a fixed phase lock with either the first or the further signal. The correction is effected on the assumption that the rate of phase change of the reference oscillator is linear. In practice, by utilising a reference oscillator of appropriate stability in relation to the time intervals, such assumption introduces negligible error.

There may be more than one further signal whose phase, with respect to the first signal, has to be determined and a single rate determining means may be used, in conjunction with the appropriate time intervals, to determine the corrections for each of the phase differences.

The arrangement has particular application in a phase comparison radio navigation system such as is described in British Pat. No. 1,399,341 in which the phase relationship of signals at a receiver is to be determined at a distant point and in which a frequency convertor and telemetry system is utilised to transmit the signals received at the receiver to the distant point, the convertor changing the frequency of the signals before they are transmitted by the telemetry system. In such an arrangement, it may not be possible, at said distant point, to reconvert said signals to exactly the radiated frequency. There may be drift in the heterodyne oscillators utilised in frequency conversion in the frequency convertor. There may also be Doppler shifts in the telemetry link. With the arrangement described above, the phase difference may be determined at said distant point and the correction means corrects not only for the difference in frequency between the reference oscillator and the signals to be compared in phase, assuming that there is a linear phase drift over the short time intervals involved but also for any linear phase drifts occurring due to errors and drift in the heterodyne frequencies employed for frequency conversion and also any other frequency errors or Doppler shift in the telemetry link.

Similar problems (apart from that of drift in the heterodyne oscillators) also arise in a system in which the frequency convertor, instead of making use of signals from a local oscillator, employs further signals radiated from one or more of the transmitters of the navigation system and which is thus particularly adapted for utilising the transmissions of the Decca Navigator system to enable the positions of a number of mobile stations to be determined at a single location.

The phase comparator described above may be used not only with such systems but also, more generally, it may be utilised at a mobile receiver.

The invention thus includes within its scope a phase comparison radio navigation system in which signals of the same frequency are radiated sequentially from spaced stations and in which a digital phase comparator as described above is provided for the determinations of the phase relationships between the signals received at a receiver. In particular it includes a system in which a telemetry link is utilised between the receiver and the digital phase comparator.

It is convenient, in the following description, to utilise the terminology of a phase comparison navigation system and to refer to a master signal and slave signals. In such a system, in the cyclic sequence, the master signal occurs first and is followed by the slave signals in succession. Conveniently, in a phase comparator for a system having two slave stations, three bi-directional digital counters are employed, and, during the master signal radiation, clock signals are counted into each of said counters for a phase count period. This period may be the time interval between a zero crossing of the reference signal and a zero crossing of the master signal or vice versa or it may be a predetermined number of such time intervals. Means are provided for counting down clock signals into the first counter during the first slave radiation for a phase count period which corresponds to the master phase count period, i.e. it contains the same number of time intervals between zero crossings as the master count period. In this case however the two signals are the first slave signal and the reference signal. Similarly the second counter is counted down during the second slave radiation for a period of time corresponding to the master phase count period, i.e. it contains the same number of time intervals between zero crossings.

The third counter counts down clock signals during a master transmission period for a time interval between zero crossings or a group of such time intervals corresponding to that used for the master count up, the counting down into the third counter being done at a time interval after the count up so that the resulting count in the counter at the end of the count down is a measure of the phase drift of the reference signal relative to the master signal during the time period between the count up and count down. This measured phase error rate is used in correcting means for correcting the counts in the first and second counters in accordance with the final count in the third counter, the corrections in the first and second counters being proportioned in accordance with the time intervals between the count up and count down into those counters compared with the time interval between the count up and count down in the third counter. It will be seen that the third counter provides a count representative of the rate of change of phase between the reference signal and the master signal. This is used, in conjunction with the known time intervals, to provide the corrections for the first and second counters so that these now provide corrected counts of the phase relationship between the master and each of the two slave signals respectively.

In a radio navigation system using a frequency convertor and telemetry system as described in the aforementioned British patent, it may be convenient to operate separate telemetry transmitters on slightly different frequencies within a predetermined frequency band. It is convenient to utilise a common frequency within the phase discriminator system irrespective of the frequency transmitted and this may readily be done by employing a heterodyne system to convert the received signal frequencies to a frequency equal or approximately equal to that of the reference oscillator. Thus a single crystal controlled reference oscillator may be utilised in the phase discriminator for phase determinations of signals on different frequencies.

In digital phase measurement techniques, the phase relation between two sinusoidal signals is measured by determining the time duration between the zero crossing points. Provided the directions of the crossovers, that is to say whether they are positive going or negative going, is consistent, it is immaterial which direction is used in the arrangement of the present invention since a 180° phase shift by taking the opposite direction of crossing for one of the waveforms will be common to both master and slave signals and will therefore be eliminated in the phase difference subtraction. The phase discriminator in such an arrangement can readily be arranged to produce a pulse having a duration corresponding to the time between these crossovers. The duration of this pulse thus varies between zero and a maximum, the maximum corresponding to 360° of phase shift. The pulses represent cyclically recurring time periods and, for this reason, such a pulse will be referred to hereinafter as the phase mark-space. In the above-described arrangement the phase mark-space may be used to gate clock pulses into the counters. It is convenient to utilise a clock frequency which is an integral multiple of the reference oscillator frequency. For averaging purposes it is convenient also to utilise a counting period covering a small integral number of cycles. The accuracy is increased by averaging over a larger number of periods, but, in determining the position of a mobile, the averaging time has to be such that the movement of the mobile can be neglected. In a typical case where telemetering is employed to transmit information from the receiver to a distant point, it may be convenient to have the reference oscillator and hence the phase discriminator mark-space output at a frequency of 10 KHz. Conveniently the clock frequency is 100 times this, that is to say 1 MHz, and the counting period is made 10 cycles of the phase mark-space waveform, that is to say 1 m sec. This provides a maximum count of 1000 for 360° and hence the counter output can be read directly in terms of percentage phase difference. Obviously, however, by appropriate choice of the clock frequency in relation to the mark-space output frequency and of the number of counting periods for averaging purposes, it is readily possible to make the counter output read directly in any required units, for example degrees of phase shift.

In order to determine accurately, from the phase difference, the phase error rate between the reference signal frequency and the comparison frequency, it is necessary that the phase differences between the master and reference signal must be determined at a known time interval apart in the sequence. Similarly in order that the phase difference between the slave and reference signals can be accurately corrected these phase differences must be determined at known, conveniently predetermined, times during the sequence. In phase comparison radio navigation systems in which transmissions are in a cyclic sequence from space stations, some signalling means, commonly an identifiable transmission from the master station, are utilised for controlling the timing of the transmissions from the slave stations. The phase comparator of the present invention may utilise means responsive to these distinctive signals to control the necessary timing for the phase difference determination and also for further operations such as clearing, loading and latching the counters.

BRIEF DESCRIPTION OF THE DRAWINGS

FIG. 5 is a block diagram illustrating how the apparatus of FIG. 1 may be used in conjunction with a frequency convertor and telemetry link from a receiver of a radio navigation system; and FIG. 6 illustrates how the apparatus of FIG. 1 may be utilised directly in the receiver of a phase comparison radio navigation system.

DESCRIPTION OF PREFERRED EMBODIMENTS

Figure 1:
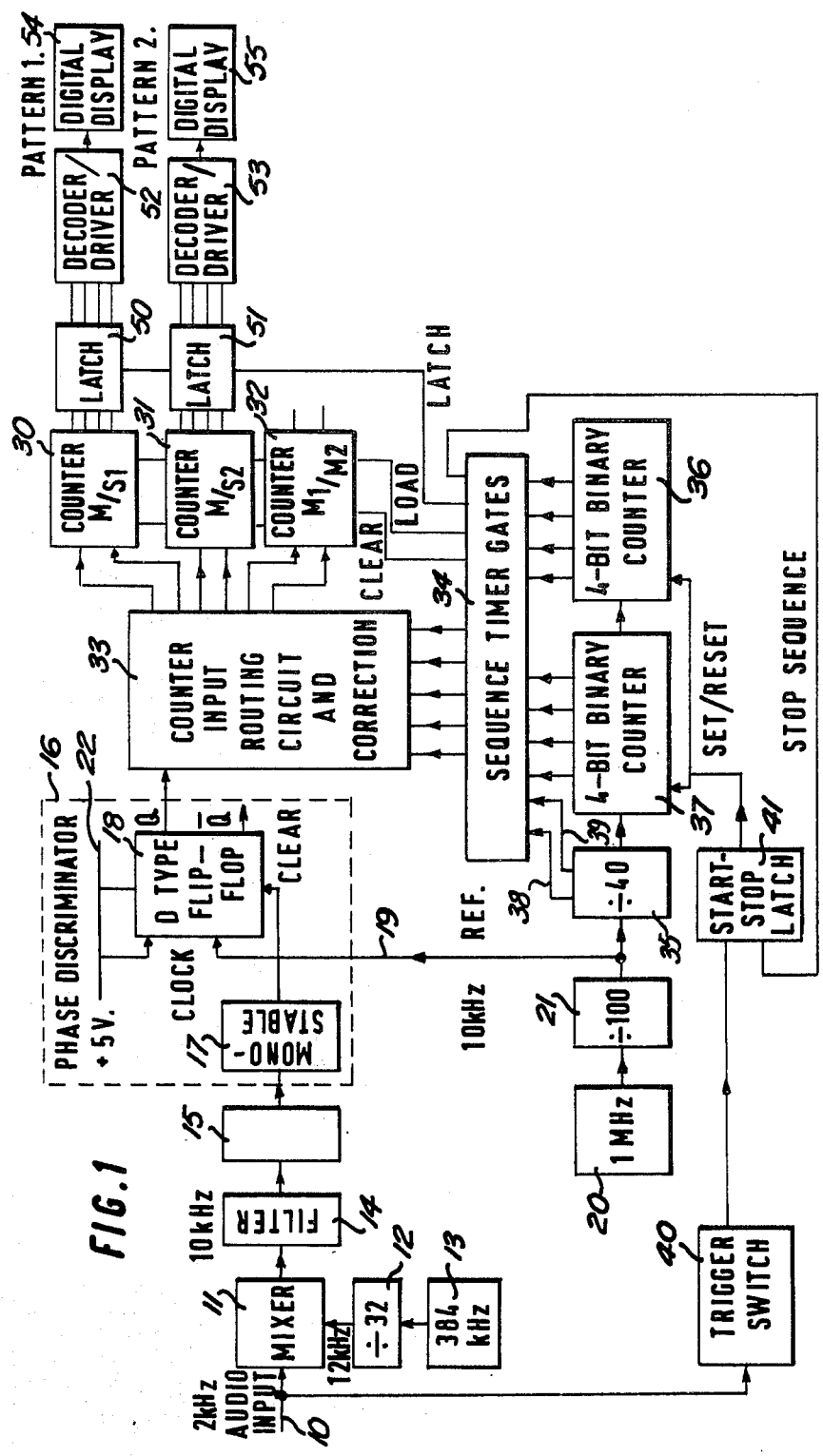
FIG. 1 is a block diagram illustrating a decoder unit for providing display of the phase relationship of information in a Hi-Fix or Sea-Fix system.
Figure 2:
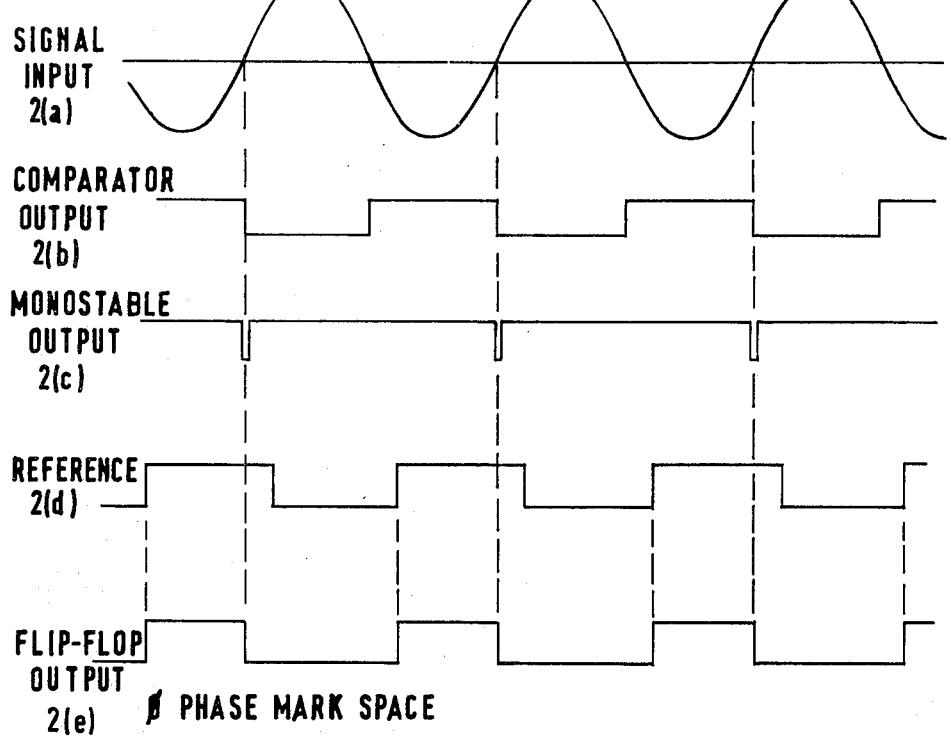
FIG. 2 is a waveform diagram illustrating waveforms at a phase discriminator in the unit of FIG. 1.

Referring to FIG. 1, the signals to be compared in phase arrive in sequence at an input 10, these signals in this particular embodiment having a frequency of 2 KHz. They are applied to a mixer 11 where they are mixed with a 12 KHz signal from a divide-by-32 divider stage 12 dividing down the output from a crystal oscillator 13 operating at 384 KHz. The output from the mixer 11 is passed through a passive narrow bandpass filter 14 with a bandwidth of 500 Hz to select the 10KHz difference frequency. The 10 KHz output from the filter is applied to a voltage comparator 15 to produce a square wave output corresponding to the filtered 10 KHz waveform. This square wave output is then applied to a phase discriminator 16 which comprises a negative edge triggered monostable 17 and a D-type edge triggered flip-flop 18. The square wave input is applied to the negative edge trigged monostable 17 to give a short duration pulse once per cycle of the 10 KHz waveform at the "clear" input of the D-type flip-flop 18. A 10 KHz reference signal on a lead 19 is applied to the "clock" input of the flip-flop. This reference signal is derived from a 1 MHz clock signal generator 20 with a 100 to 1 divider stage 21. The clock oscillator is also a crystal oscillator and thus the frequencies of the two signals applied to the flip-flop will be approximately equal although there may be a small frequency difference giving rise to a phase drift, the correction of which will be discussed later. The D input of the flip-flop is connected to the positive supply rail 22. FIG. 2 shows the waveforms at the phase discriminator and at the output from the filter 14. In FIG. 2a there is shown the sinusoidal waveform from the filter 14. FIG. 2b shows this waveform after squaring in voltage comparator 15 which acts as a crossover detector. This square wave output applied to the negative edge triggered monostable 17 gives the short duration pulses shown in FIG. 2c. The 10 Hz square waveform from the reference oscillator 20 and divider 21 is shown in FIG. 2d. The waveform at the Q output from the flip-flop is shown at FIG. 2e and it will be seen that this consists of a square waveform with the pulses starting at the positive edge of the reference signal and terminating at the monostable output. The duration of these pulses is the required phase mark-space between the input signal and the reference signal.

It will be remembered that the signal at input 10 comprises a sequence of different signals, the phase relationship of which is to be determined. Thus the phase discriminator output will comprise a signal of the form shown in FIG. 2e with the pulse duration of the square wave outputs during the different time periods corresponding to the different phase relationships of the input signals compared with the reference signal. Essentially the phase mark-space waveform is used to gate a train of clock pulses to a counter for a fixed length of time. In this particular unit, the phase discriminator mark-space output has a frequency of 10 KHz. The counters employ a clock frequency of 1 MHz and the counting period covers, for averaging purposes, 10 cycles of the phase mark-space waveform, that is to say 1 m sec thereby providing a maximum count of 1000 for 360° of phase shift. Such a count is referred to hereinafter as a mark-space phase difference count. Three bi-directional counters 30, 31 and 32 are provided each being a binary coded decimal counter with a capacity of up to 999. The mark-space signals from the phase discriminator output are applied to the counters through a counter input routing circuit and correction circuit 33, the operation of which is controlled by sequence timer gates 34 so that the signals are fed to the counters as described below. The sequence timer gates 34 are controlled by the 1 MHz clock 20 with its divider 21, the 10 KHz output thereof, which is fed on lead 19 to the discriminator 16, being divided by a factor of 40 in a divider 35 and applied to two 4-bit binary counters 36, 37 which enable any 4 m sec period in a total of 256 such periods to be selected using an eight-input NAND gate in the gate unit 34. The counters 36, 37 are set using a trigger pulse derived by a trigger switch 40 from the signals on the input lead 10. In this particular arrangement, which is for operation with the Decca Hi-Fix or Sea-Fix system, the trigger switch is responsive to the synchronising burst at a frequency 60 Hz below the normal radiated frequencies which burst is radiated in these systems for synchronising the slave transmitters and the receiver. The trigger switch 40 responds to this short duration burst and provides an output to a start/stop latch 41 which initiates the sequence timer.

In order to select 1 m sec periods necessary to gate the mark-space phase difference count, the selected 4 m sec pulse from the sequence timer is combined with 2 m sec pulses from the 250 Hz train on line 38 from divider 35 and 1 m sec pulses on line 39 from the 500 Hz train in divider 35, the combination being effected in a NAND arrangement in gate unit 34 to gate only one selected 1 m sec of the 4 m sec period. The selected 1 m sec period will contain 10 cycles of the phase mark-space output from the discriminator.

In order to determine the phase relations between the incoming signals, the counters 30, 31 and 32 are firstly all arranged to count up during a selected 1 m sec period in the master transmission so as to have a count related to the phase mark-space between the master signal and the reference signal. During the first slave transmission, the phase mark-space from the discriminator 16 is used to gate clock signals into the count-down input of the counter 30. For 1 m sec during the second slave transmission, the phase mark-space output from the discriminator 16 is used to gate clock signals into the count-down input of the counter 31. The third counter 32 is counted down using clock signals gated by the phase mark-space for 1 m sec during reception of master signals, this count down being at a time different from and subsequent to the initial count up.

Figure 3:
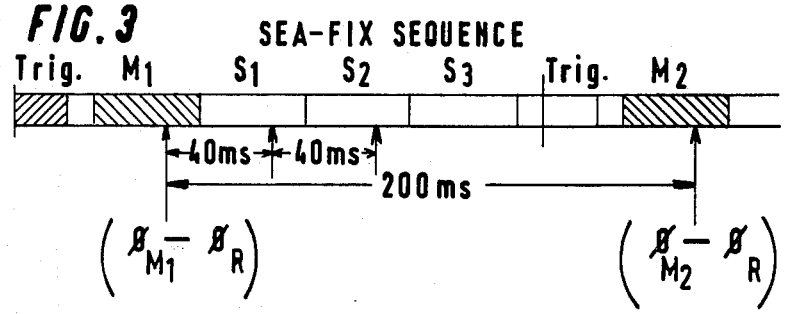
FIGS. 3 and 4 are diagrams illustrating sequences of operation for Sea-Fix and Hi-Fix receivers respectively.
Figure 4:
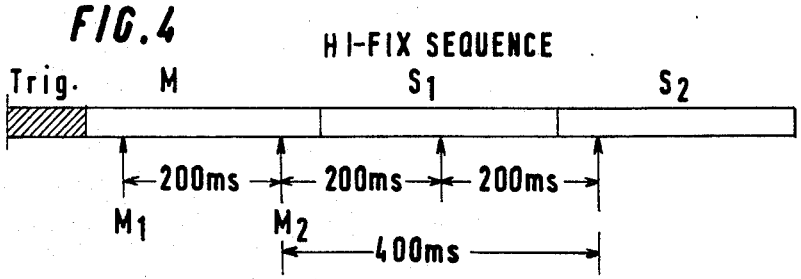

FIGS. 3 and 4 illustrate respectively the timing sequences for Sea-Fix and Hi-Fix. In the Sea-Fix system where the time interval between successive master transmissions is about 200 m secs, it is convenient to effect the count-up in one transmission from the master and to effect the count-down during the next transmission. Since the time duration of the two counts is the same, if the phase relation between the incoming signal and the reference remained constant, the counter would count down to exactly zero. In practice however there is some slight difference between the frequency of the incoming signal and the reference frequency and hence the counter has a residual count, which may be positive or negative, representative of the change in relative phase of these two signals during this 200 m sec period. For correction purposes, it is assumed that any such change of phase occurs at a linear rate over this short period and that therefore fractions of this change may be applied as corrections to counters 30 and 31 corresponding to the time intervals between the count-up and count-down. For the Sea-Fix system, the count-down for the first slave may conveniently take place 40 m secs after the count-up and the count-down for the second slave may take place 80 m secs after the count-up. Thus 1/5 and 2/5 of the total left in counter 32 has to be applied to the counters 30 and 31 respectively as a correction.

For Hi-Fix, as shown in FIG. 4, the time duration between the successive master transmissions is very much greater than for Sea-Fix and the duration of each individual transmission is approximately 300 m secs. It is convenient in that case therefore to effect the two measurements of the phase relationship between the master signal and the reference signal during one master transmission. These two measurements are indicated diagrammatically at M1 and M2 in FIG. 4 at time intervals spaced apart by 200 m secs. The successive slave phase comparisons are made at 200 and 400 m secs after the second comparison of the master and reference signals. In this case, the residual count in the counter 32 is applied directly as a correction in the appropriate sense to counter 30 and twice this count is applied to the counter 31. In other words, the rate of phase change of the reference signal with respect to the master signal is found over a 200 m sec period and is assumed to be linear and is extrapolated to give phase corrections during the slave/reference phase measurements. These corrections are effected in counters 30 and 31 by counting to zero the remainder in the counter 32 and at the same time feeding proportional counts in the appropriate direction to the counters 30 and 31.

For both Hi-Fix and Sea-Fix, the direction of the correction is determined by the routing logic circuit. The necessary proportional factor is derived, in the case of Sea-Fix from a decade counter in unit 33 working in the quinary mode, that is modulo 5. For the Hi-Fix system the proportional factor for the second slave is obtained by applying correction directly to counter 31 and frequency dividing by 2 in unit 33 before applying the correcting pulse train to the counters 30 and 32.

The polarity of the correction is conveniently determined by switch means responsive to a polarity signal obtained by having a crossover detector responsive to the zero crossing on the count up and the count-down in the counter 32 during the master to reference phase comparison. A routing latch is provided which is initially set down but is inverted when the counter crosses zero, so that the correction will be down if the counter stops short of zero and will be up if the counter goes beyond zero.

The outputs from the counters 30 and 31 are applied to latches 50, 51 which store the binary coded decimal output from the two most significant decimal figures in the counts and these are fed to decoder/drivers 52, 53 driving decimal digit displays 54, 55, typically formed by light-emitting diodes.

FIG. 5 illustrates the application of the apparatus of FIG. 1 to a radio navigation system embodying the frequency convertor and telemetry link as described in British Pat. No. 1,399,341. In FIG. 5 there is shown a receiver 60 for a Decca Hi-Fix or Sea-Fix system incorporating a frequency converter changing the signals to 2 KHz as described in the aforementioned patent and transmitting these signals over a link to a distant receiver 62. At the receiver, the 2 KHz output is fed to the mixer 11 and thence through the filter to the remainder of the decoder and display indicated diagrammatically at 64.

FIG. 6 illustrates how the apparatus of FIG. 1 may be utilised directly in a radio navigation receiver, for example a receiver for a Decca Hi-Fix or Sea-Fix system. FIG. 6 illustrates the receiver as comprising a receiving antenna 70 with a tuned receiver 71 feeding a mixer 72 where the received signals are heterodyned with signals from an oscillator 73 to give an intermediate frequency output at 10 KHz. The appropriate sideband is selected by a filter 74, to provide signals which are fed via a limiter 75 or AGC circuit to a narrow passband filter 76 corresponding to the filter 14 of FIG. 1. The output from this is then fed into a unit 77 corresponding to the remainder of the decoder and display unit of FIG. 1.

Although in describing the counters, mention has been made of setting them to zero, in practice the two master/slave counters are initially loaded with a count of 005 so that when the output of the two more significant decade counters is displayed to give the percentage position-in-lane, the value will be correctly rounded to the nearest significant figure. It is convenient also in the $M_1/M_2$ counter to start with a count of 500 so that the zero count 000 will correspond to 500 and the 'borrow' and 'carry' pulses produced by the zero-crossing of the most significant counter can be used to indicate the direction of crossing the 500 count, which is required to determine the polarity of the correction.

In the Sea-Fix system described above where the proportional correction applied to the master-slave counters is a fraction of the $M_1 \rightarrow M_2$ phase error measured over one sequence period, the magnitude of the $M_1 \rightarrow M_2$ error must be less than half a cycle to yield a true correction, which limits the correction range to a frequency error of ± 2.5 Hz. It is readily possible to ensure that the reference frequency stability and more particularly the local oscillator accuracy and stability in any frequency converter is such that the $M_1 \rightarrow M_2$ error is less than half a cycle.

In the Hi-Fix arrangement where the master-slave corrections are extrapolated and are an integral multiple of the $M_1 \rightarrow M_2$ error, the $M_1 \rightarrow M_2$ error is no longer limited to half a cycle and the correction range is extensively increased. The frequency stability requirements in this respect are even less onerous.

We claim:

1. A digital phase comparator for determining the phase relationship between a first signal and a further signal of the same frequency which signals are available sequentially in a regular cyclic sequence comprising a reference oscillator of a frequency equal to or approximately equal to the frequency of said signals, digital phase determining means arranged to determine the phase relationships between a signal from the reference oscillator and each of the first and the further signals and including subtracting means arranged to determine the difference between these two phase relationships, means arranged to determine the rate of phase change between the first signal and the reference signal, and correction means utilising the rate information as a measure of the rate of phase change of the reference signal to correct the phase difference determination between the further signal and the reference signal in accordance with this rate and the time period between the determinations of the phase relationships between the first signal with respect to the reference and the further signal with respect to the reference signal for any change in the phase of the reference signal with respect to the first signal during that time period.

2. A digital phase comparator as claimed in claim 1 wherein said digital phase determining means comprises a clock pulse source, a plurality of bi-directional counters corresponding to the number of said first and further signals to be compared in phase, and gate means for gating pulses from the clock pulse source into the counters, said gate means being controlled so that each counter counts in one direction for a time interval dependent on the phase difference between a respective one of said first and further signals and the reference oscillator output and so that all the counters count in the opposite direction for a time interval dependent on the phase difference between said first signal, referred to hereinafter as the master signal and the reference oscillator output.

3. A digital phase comparator as claimed in claim 2 wherein said gate means are arranged so that each counter counts up for a time interval dependent on the phase difference between master signal and reference oscillator output and then counts down for the time interval dependent on the phase difference between the respective further signal and the reference oscillator.

4. A digital phase comparator as claimed in claim 2 wherein the clock pulse source has a frequency which is an integral multiple of the reference oscillator frequency.

5. A phase comparison radio navigation system in which signals of the same frequency are radiated sequentially from spaced stations and in which a digital phase comparator as claimed in claim 1 is provided for the determinations of the phase relationships between the signals received at a reciever.

6. In a phase comparison radio navigation system having a master station radiating at least one master signal and two slave stations radiating slave signals, the signals being of the same frequency and being radiated in a cyclic sequence, and means for receiving the radiated signals; a digital phase comparator comprising a reference oscillator of a frequency approximately equal to the frequency of said signals, a clock pulse source, three bi-directional digital counters, gate means for gating pulses from the clock pulse source into the counters, said gate means being controlled by the received signals so that each counter counts in one direction for a time interval dependent on the phase difference between the received master signal and the reference oscillator output and so that clock signals are counted down into the first counter during the first slave radiation for a phase count period which corresponds to the master phase count period, i.e. it contains the same number of time intervals between zero crossings as the master count period and the second counter counts down clock signals during the second slave radiation for a period of time corresponding to the master phase count period, i.e. it contains the same number of time intervals between zero crossings and so that the third counter counts down clock signals during a master transmission period for a time interval between zero crossings or a group of such time intervals corresponding to that used for the master count up, the counting down into the third counter being done at a time interval after the count up so that the resulting count in the counter at the end of the count down is a measure of the phase drift of the reference signal relative to the master signal during the time period between the count up and count down, and correction means utilising the final count in the third counter as a measure of the rate of phase change of the reference signal to correct the phase difference determinations in the first and second counters between the received slave signals and the reference signal in accordance with this rate and the respective time periods between the determinations of the phase relationships between the received master signal with respect to the reference and the received slave signals with respect to the reference signal for any change in the phase of the reference signal with respect to the received master signal during that time period, the corrections in the first and second counters being proportioned to the final count in the third counter in accordance with the time intervals between the count up and count down into those counters compared with the time interval between the count up and count down in the third counter.

7. A radio navigation system as claimed in claim 6 wherein said predetermined phase count period is the time interval between a zero crossing of the reference signal and a zero crossing of the master signal.

8. A radio navigation system as claimed in claim 6 wherein said predetermined phase count period is a predetermined plurality of time intervals between a zero crossing of the reference signal and a zero crossing of the master signal.

9. A digital phase comparator as claimed in claim 2 wherein said correction means utilises the net count in one of the counters which counts up and counts down during respective time intervals dependent on the phase difference between the master signal and the reference oscillator output at times with a predetermined time being means bbeing provided to adjust the net counts on the other counters by amounts related to the net count on said one counter by factors corresponding to the respective ratios of the time intervals between count up and count down of the respective other counters to the time interval between count up and count down for said one counter.

* * * * *